(12) United States Patent
Matsunaga

(10) Patent No.: US 9,608,174 B2
(45) Date of Patent: Mar. 28, 2017

(54) COATING METHOD AND DEVICE

(71) Applicant: Masafumi Matsunaga, Yokohama (JP)

(72) Inventor: Masafumi Matsunaga, Yokohama (JP)

(73) Assignee: Mtek-smart Corporation, Yokohama-shi, Kanagawa (JP)

( * ) Notice: Subject to any disclaimer, the term of this patent is extended or adjusted under 35 U.S.C. 154(b) by 223 days.

(21) Appl. No.: 14/377,855

(22) PCT Filed: Jan. 8, 2013

(86) PCT No.: PCT/JP2013/050125
§ 371 (c)(1),
(2) Date: Feb. 2, 2015

(87) PCT Pub. No.: WO2013/108669
PCT Pub. Date: Jul. 25, 2013

(65) Prior Publication Data
US 2015/0155448 A1 Jun. 4, 2015

(30) Foreign Application Priority Data
Jan. 16, 2012 (JP) .................................. 2012-006062

(51) Int. Cl.
*H01L 33/50* (2010.01)
*B05C 15/00* (2006.01)
(Continued)

(52) U.S. Cl.
CPC .......... *H01L 33/501* (2013.01); *B05B 12/084* (2013.01); *B05B 15/1288* (2013.01);
(Continued)

(58) Field of Classification Search
CPC .................. B05C 11/1015; B05B 15/1288
See application file for complete search history.

(56) References Cited

U.S. PATENT DOCUMENTS

| 2006/0029724 A1 | 2/2006 | Babiarz et al. |
| 2008/0204490 A1 | 8/2008 | Kojima |

(Continued)

FOREIGN PATENT DOCUMENTS

| JP | 2006-167544 A | 6/2006 |
| JP | 2009-014429 A | 1/2009 |

(Continued)

OTHER PUBLICATIONS

Extended European Search Report issued Oct. 26, 2015, in European Patent Application No. EP13738318.8.

*Primary Examiner* — Caleb Henry
*Assistant Examiner* — Mounir Amer
(74) *Attorney, Agent, or Firm* — Shapiro, Gabor and Rosenberger, PLLC

(57) ABSTRACT

[PROBLEM TO BE SOLVED] To provide a method and apparatus for applying a coating material that reacts at ordinary temperatures and increases in viscosity with lapse of time or a coating material that is difficult to handle, such as an unstable slurry in which sedimentation occurs at high rate, to a high-value-added object to be coated.
[SOLUTION] Before at least applying coating material to an object to be coated, the coating amount is automatically measured using a highly-accurate measuring device set in an atmosphere that does not substantially affect the measurement to control the coating amount during production. Therefore, high-quality products can be mass-produced with a low production cost.

15 Claims, 5 Drawing Sheets

(51) Int. Cl.
  *B05C 11/10* (2006.01)
  *B05C 9/10* (2006.01)
  *B05B 15/12* (2006.01)
  *B05B 12/08* (2006.01)
  *B05C 5/02* (2006.01)
  *B05B 13/04* (2006.01)

(52) U.S. Cl.
  CPC ............... *B05C 5/02* (2013.01); *B05C 9/10* (2013.01); *B05C 11/1015* (2013.01); *B05C 15/00* (2013.01); *B05B 13/04* (2013.01); *H01L 33/507* (2013.01); *H01L 2933/0041* (2013.01)

(56) References Cited

U.S. PATENT DOCUMENTS

| | | |
|---|---|---|
| 2009/0008159 A1 | 1/2009 | Yamamoto et al. |
| 2009/0027434 A1 | 1/2009 | Kojima |

FOREIGN PATENT DOCUMENTS

| | | |
|---|---|---|
| JP | 2009-022845 A | 2/2009 |
| JP | 2009-288249 A | 12/2009 |

COATING METHOD AND DEVICE

TECHNICAL FIELD

The present invention relates to a method for applying coating material to an object to be coated, more particularly to a method and apparatus for applying a slurry containing a mixture of a binder and particles such as phosphor particles or the like to an object to be coated such as an LED or an LED component, and more advantageously to a method and apparatus for applying a low-viscosity coating material containing a volatile component such as a solvent. The application (or coating application) in the context of the present invention includes continuous or intermittent dispensing, ink-jet, application using micro curtain, application using a slot nozzle, application by atomizing, and spraying, but the method or apparatus of the present invention is not limited by them. Moreover, no limitations are placed on the material, shape and other properties of the object to be coated.

BACKGROUND ART

Phosphor slurry coating applied to an LED can be a representative example of coating material because it is difficult to treat, requires a high degree of uniformity, and enjoys advantages of uniformity. In conventional methods of manufacturing white light LEDs, a slurry containing at least one kind of phosphor such as YAG, TAG, or silica-based material and a binder mixed together is dispensed onto an ultraviolet or blue light emitting diode using a dispenser to coat it, a like slurry further containing a solvent added to reduce the viscosity is directly sprayed to the LED using an ultrasonic atomizer, which is a kind of fine particle generating device, or a spray device to coat it, a phosphor plate or film is prepared to cover the LED, or a phosphor sheet called a remote phosphor is prepared and attached at a location remote from the LED.

Patent Literature 1 discloses a method for manufacturing an LED by circulating a slurry using a circulator and applying the slurry containing a phosphor to a heated LED chip by spraying while whirling the slurry in a spiral manner with compressed air, thereby applying the slurry to a side surface of the LED, which is considered to be difficult to coat by common spraying methods.

Patent Literature 2 discloses a process of coating an LED chip with a binder such as silicone and curing it, applying a slurry containing a phosphor, a binder, and a solvent, which may be mixed with a diffuser if necessary, onto it to form a lamination while making a pass/fail judgment by measuring the color temperature.

Patent Literature 3 discloses a process of transferring a slurry composed of a phosphor, a binder, and a solvent having a viscosity between 0.1 and 200 centipoises between two syringes, applying teaching of Japanese Patent Application Laid-Open No. 2004-300000, and applying the slurry to a chip multiple times while whirling the spray stream employing an air pulse spray taught by Japanese Patent Application Laid-Open No. 59-281013.

Patent Literature 4 discloses an apparatus in which a viscous material having a viscosity effectively higher than 100 centipoises (100 mPa·s) supplied from a reservoir through a metering device such as an auger valve is dispensed through a dispensing element (needle), and a measuring apparatus receives and measures a metered quantity of viscous material to adjust the moving speed of a robot and the discharge speed of the viscous material through the needle.

A method using a dispenser as disclosed in Non-Patent Literature 1 is widely employed to fill a cup in which a chip is mounted with the slurry for mass production of artillery-shell-shaped LEDs of not high power and LEDs for back light for TV sets or PCs.

It is true that the method according to Patent Literature 1 is ideal in the aspect that sedimentation of phosphor particles is harder to occur than in the case with common apparatuses because of the circulation of the slurry containing the phosphor particles, but the method uses a large circuit and needs a material several to twenty times as expensive as a material needed for application. Moreover, because the circuit is complex, a slight amount of sedimentation and clogging occur at many locations in the circuit, leading to instability in the coating amount.

In the method disclosed in Patent Literature 2, an LED chip is coated with a binder, then it is cured, and thereafter a slurry containing phosphor is applied thereon by air spraying to form a lamination. Moreover, the color temperature is measured during the process, and the process is allowed to proceed to the next step only when it satisfies a criterion. However, measuring the color temperature in the production line on a layer-by-layer basis requires a complex process and expensive equipment. Moreover, it is necessary to process LED chips one by one, taking too long time.

The method disclosed in Patent Literature 3 is suitably employed in the R & D or in cases where middle scale production is desired, because of the efficient circulation of a small quantity of material. However, making the set air pressure low to decrease the circulation speed causes sedimentation, and making the air pressure high to increase the circulation speed leads to higher shear than necessary acting on the slurry, whereby the viscosity is decreased with the lapse of time, and the quantity of the applied material tends to increase. Therefore, the weight is checked frequently by manual operation during the coating application to the work.

On the other hand, in case where a slurry without solvent containing a binder such as silicone and phosphor particles is applied through a dispenser using a simple apparatus like one disclosed in Non-Patent Literature 1, sedimentation tends not to occur because of relatively high viscosity. Nevertheless, sedimentation eventually occurs with the lapse of time. Therefore, a positive displacement pump such as a small-size auger pump or a plunger pump, which enables easy control of the coating weight, is commonly employed. However, the specific gravity changes with sedimentation, leading to unevenness of quality. In order to improve the quality no matter how small a degree is, coating operation is performed while checking the weight using a measuring device in the coating booth applying the teaching of Patent Literature 4, in some cases. However, in the case where a slurry containing a volatile component such as a solvent is applied by spraying or the like process, the coating booth needs ventilation. Specifically, it is mandatory that the face velocity near the spray booth door be 0.4 meter per second or higher. Therefore, the fast air flow adversely affects the measuring device and the spray flow gives an impact on the measurement plate or the like, which leads to another problem.

CITATION LIST

Patent Literature

Patent Literature 1: Japanese Patent Application Laid-Open No. 2005-152811

Patent Literature 2: Japanese Patent Application Laid-Open No. 2010-119945
Patent Literature 3: TW201034759A1
Patent Literature 4: Japanese Patent Application Laid-Open No. H11-513607

Non-Patent Literature

Non-Patent Literature 1: Catalogue of MUSASHI ENGINEERING

SUMMARY OF THE INVENTION

Problem to be Solved by the Invention

In the case, in particular, where a high-power LED used for illumination is coated with phosphor, it is common understanding that smaller film thicknesses of the phosphor coating on the LED lead to better performances because of shorter air distances or distances from the surface of the LED to the molded lens. Hence, it is common understanding that the phosphor-on-LED is more advantageous in performance-wise than the remote phosphor. Therefore, it is preferable, according to common understanding, that the amount of the binder, which is used only as means for adhering the phosphor to the LED, be made as small as possible, so long as the adhesiveness to the LED is ensured. To improve durability and color fastness, binder materials used have been shifting nowadays from epoxy-based resins to silicone-based resins, which have poor wettability. There have also been developed methods in which a liquid glass is used and coating is eventually cured by sol-gel process to enhance heat resistance and color fastness. In the case of the spraying method also, if a wet thick coating is formed, the coating becomes thin in the edge portion on the top face of the chip, as described above, due to sinking of the coating caused by the effect of surface tension and interfacial tension on the surface of the binder or the chip surface, resulting in unsatisfactory quality. Moreover, the coating on the side surface also suffers from the above-described phenomenon, leading to a high degree of unevenness in the color temperature in the respective spaces in particular. In the industry, many companies involved are competitively tackling this problem.

Since wettability of silicone binders on the chip is poor as described above, it is necessary to improve the wetting by modifying the chip surface through corona, plasma, or frame treatment and/or to perform forcible wetting for leveling. However, if a wet thick coating is formed using a slurry with low viscosity, sags will occur on the edge and the side surface. Therefore, it is difficult to maintain required coating in these portions.

On the other hand, the above-described problems are not encountered with a multilayer coating that is dried every time each layer is applied. However, this method suffers from very low productivity because additional time taken by operations of detaching/attaching a work, drying the work, and manually measuring the coating weight is much longer than the time taken by coating.

If the coating weight can be measured automatically, in the case of, for example, single layer coating, while insufficient coating weight can be corrected by further coating, excessive coating weight makes the product defective. In the case of two-or-three-layer coating, if a slurry with which the amount of coating tends to be unstable or a slurry with low viscosity is used with a positive displacement pump, the probability that the product is determined to be defective in the final coating step is high. For the above reasons, the process of applying coating to an actual object to be coated and directly measuring the weight of the coating entails high risk.

Although thin multi-layer coating is essential to the above applications, if a binder such as a silicone binder having a high viscosity higher than 5,000 mPa·s (5,000 centipoises) or several tens thousands mPa·s (centipoises), of which the volume contraction with curing is small, is used, the viscosity of the slurry becomes high. Consequently, it is not possible to atomize the slurry into fine particles by means of small droplet application dispensing, inkjet, or spraying etc. for discharging dots at high speed to carry out coating. Moreover, if a silicone having high viscosity as mentioned above is used, it is not possible to make the weight proportion of the phosphor in the slurry higher than 30% or preferably 50% because of the lack of fluidity.

Therefore, it is practical to use an organic solvent as means for reducing the viscosity. However, adding an organic solvent to the aforementioned slurry to make the viscosity lower than 100 mPa·s (centipoises), preferably lower than 50 mPa·s (centipoises) will greatly increase sedimentation of phosphor, and it is impossible to keep the coating amount within ±5%, preferably ±1.5% of a set value using a common dispenser or a common inkjet or spray apparatus.

Means for Solving the Problems

The present invention has been made in order to solve the above-described problems. An object of the present invention is to provide a coating application method and apparatus far better in performance than prior arts and having high productivity and to provide products such as LEDs that are produced by such a method and apparatus. Another object is to provide a coating application method and apparatus that are advantageous in hygiene and safety even when a slurry containing an organic solvent is used if applied together with the method disclosed in commonly owned PCT/JP2011/050168 whose inventor is the same as the present application and can reduce the production cost greatly.

To solve the above problem, according to the present invention, there is provided a liquid application method for applying coating material to an object to be coated using an applicator in an atmosphere of a gas flow, characterized by comprising: a first step of applying said coating material to an object for coating weight measurement by said applicator before coating application to said object to be coated; and a second step of automatically transferring said object for coating weight measurement to which the coating material has been applied to a weight measurement chamber in which at least a portion of a measuring part of a weight measuring device is exposed or disposed and the atmosphere is free from a gas flow or has a gas flow which does not affect weight measurement and measuring the weight of it, wherein while if the coating weight falls within a predetermine range, coating application to the object to be coated is performed, if the coating weight falls out of the predetermined range, coating application to the object to be coated is performed after correcting a coating condition.

To solve the above problem, according to the present invention, there is provided a coating application method characterized in that after the completion of coating application to said object to be coated, coating weight measurement is performed automatically again to check the coating amount, and thereafter the coated object is transferred to a drying apparatus.

To solve the above problem, according to the present invention, there is provided a coating application method characterized in that the coating application to said object for weight measurement is performed in a coating booth which is connected at least to an exhaust line and which is in an atmosphere of a gas flow and that the location at which the coating application to said object for coating weight measurement is performed and the coating weight measurement chamber are adjacent to each other.

To solve the above problem, it is preferred that said applicator and said object to be coated be moved relatively and that the applicator be selected from at least one of a dispenser which can apply coating in a pulsed manner, inkjet, and application device which generates fine particles.

To solve the above problem, it is preferred that said coating condition corrected includes at least one of the pressure of the coating material, relative speed of the applicator and the object to be coated, coating pitch, pulse cycle, duration of coating application of one shot, and flow channel area.

To solve the above problem, it is preferred that said object to be coated be an LED or LED component and that said coating material be a slurry containing a phosphor and a binder.

To solve the above problem, according to the present invention, there is provided a coating application method characterized in that said applicator is an application device which generates fine particles, that after said slurry is applied to said object for weight measurement and the weight measurement is performed in said coating weight measurement chamber, said application device which generates fine particles and the LED or LED component shift relative to each other by a pitch, and that coating application is performed with the position of line feed pitch being shifted every time coating of one layer is finished.

To solve the above problem, according to the present invention, there is provided a coating application method characterized in that said application device which generates fine particles is an air spray device, that the distance between an ejection part at an end of the air spray device and the LED or a group of LEDs is adjustable in a range between 5 and 80 millimeters, that the ejection part and the LED or the group of LEDs are relatively shifted at a pitch between 2 and 15 millimeters, and that coating application is performed with the phase being shifted by 0.1 to 7.5 millimeters every time coating of one layer is finished.

To solve the above problem, according to the present invention, there is provided a method of manufacturing an LED or LED component characterized in that the weight proportion of the phosphor in said slurry is larger than that of said binder and that said slurry contains a solvent and has a viscosity between 1 and 100 mPa·s (between 1 and 100 centipoises).

To solve the above problem, according to the present invention, there is provided a coating application method characterized in that said slurry is circulated by a circulation device or moved between two or more small containers to avoid sedimentation of the phosphor.

To solve the above problem it is preferred that coating application to said object for coating weight measurement and the object to be coated be performed in a pulsed manner at a frequency between 1 and 100 hertz.

To solve the above problem, according to the present invention, there is provided a coating application apparatus for applying coating material to an object to be coated by an applicator in a coating booth which is connected at least to an exhaust line, comprising: a first step of applying said coating material to an object for coating weight measurement by said applicator in said coating booth before coating application to said object to be coated; and a second step of automatically transferring said object for coating weight measurement to which the coating material has been applied to a coating weight measurement chamber which is adjacent to said coating booth and in which at least a measuring part of a weight measuring device or a portion thereof is exposed or disposed and measuring the weight of it, wherein if the coating weight falls within a predetermined range, coating application to the object to be coated is started.

To solve the above problem, according to the present invention, there is provided an apparatus characterized in that a shutter which can be automatically opened and closed is provided on an opening of a partition between said coating booth and said coating weight measurement chamber, the shutter being automatically closed during the application of the coating material and during the weight measurement and made open during the transfer of said object for coating weight measurement.

To solve the above problem, it is desirable that a thin, light-weight object be provided as a part of the measuring part in the upper portion of said coating weight measuring device, so that measuring operation is performed quickly.

To solve the above problem, according to the present invention, there is provided an apparatus characterized in that said coating material is a slurry containing a phosphor and a silicone solution, that said applicator is an air spray device which sprays in a pulsed manner, that said object to be coated is an LED or LED component, that said air spray device and the LED or LED component shift relative to each other by a pitch for coating application, and that coating application is performed in a plurality of layers with an offset being made every time coating of one layer is finished.

Advantageous Effect of the Invention

As described above, the method and apparatus for applying coating material according to the present invention can carry out measurement of coating weight automatically in a coating weight measurement chamber which is not affected by disturbance and applies coating to an object to be coated based on the measurement data. Therefore, it is possible to produce high-quality products efficiently.

EMBODIMENT FOR CARRYING OUT THE INVENTION

In the following, a preferred embodiment of the present invention will be described with reference to the drawings. The following embodiment is given only for the illustrative purpose to facilitate the understanding of the invention, and not intended to exclude feasible additions, replacements, and modifications made thereto by persons skilled in the art without departing from the technical scope of the present invention.

The drawings schematically show a preferred embodiment of the present invention.

Figure 1:
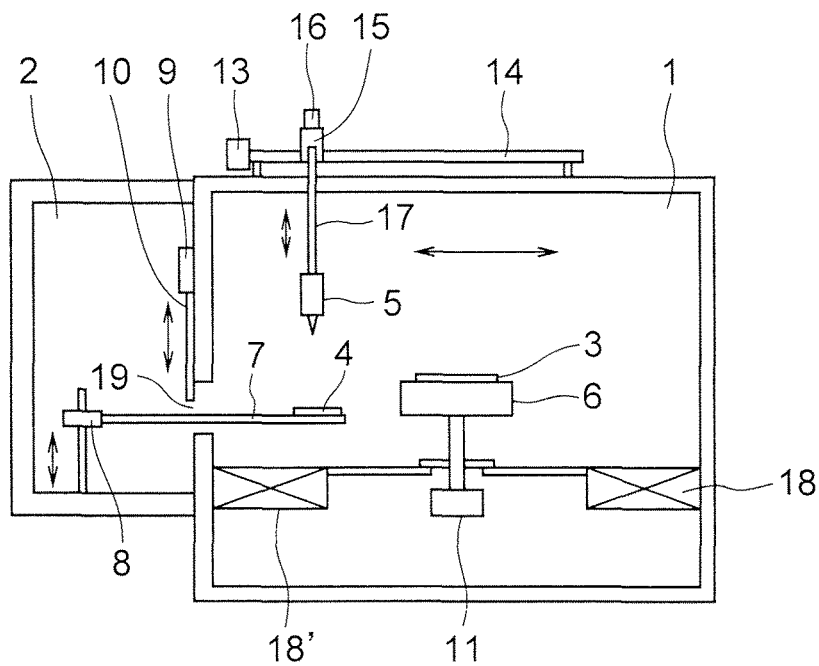
FIG. 1 is a schematic cross sectional view of a coating application apparatus according to an embodiment of the present invention as seen from its front.
Figure 2:
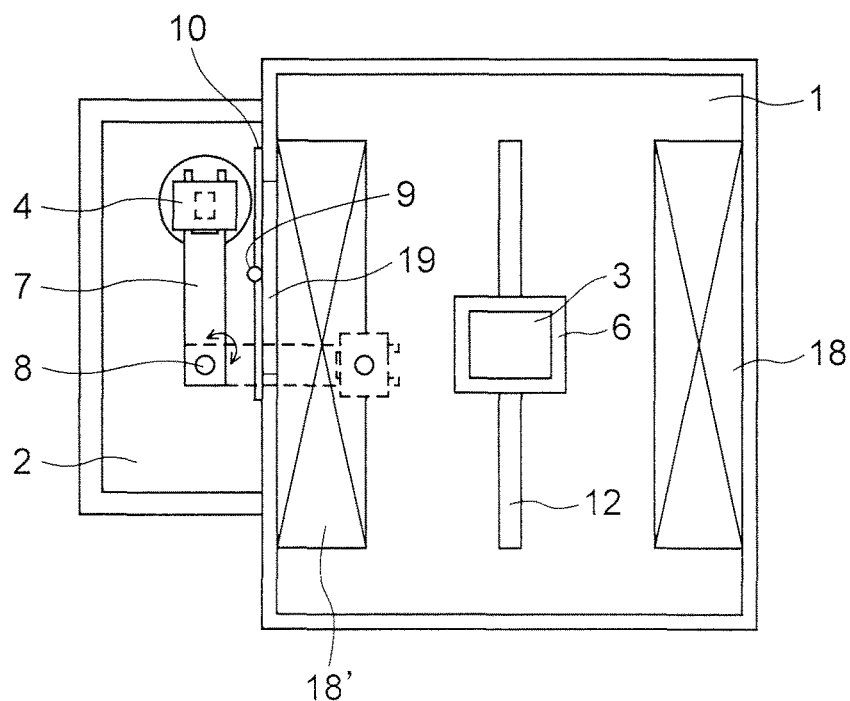
FIG. 2 is a schematic plan view of the coating application apparatus according to the embodiment of the present invention.

FIGS. 1 and 2 show a coating application apparatus according to an embodiment of the present invention. FIG. 1 is a schematic cross sectional view of the coating application apparatus seen from its side, and FIG. 2 is a schematic plan view. FIGS. 3 to 9 show details of a weight measurement part. FIG. 10 is a chart of a pulse cycle.

The apparatus shown in FIGS. 1 and 2 is provided with an air intake or air supply part (not shown) arranged upstream of an applicator 5 in a coating booth 1 and an exhaust part 18 arranged downstream of an object to be coated 3. The exhaust part 18 is normally connected with an exhaust fan provided outside the apparatus. Operation of the exhaust fan generates ideal air flow in the coating booth 1. Before coating on the object to be coated is started, a handling bracket on which an object for weight measurement 4 is set moves to a desired position in the coating booth 1 through an opening 19 between the coating booth 1 and a coating weight measurement chamber 2 with a shutter 10 of the opening/closing device 9 being open. Coating material is applied to the weight measurement object 4 having a plate-like or container-like shape set on the end part of the handling bracket 7 by an applicator 5 located upstream of the weight measurement object 4. Then, it is returned to the coating weight measurement chamber, where the total weight is measured with the shutter being closed.

The weight measurement object 4 has been measured beforehand, and therefore the weight of the coating can be displayed and a signal indicating the pass/fail can be output automatically by simple processing by a sequencer using, for example, a measuring device AD-4212B-101 by A&D, which is capable of external communication and whose minimum display unit is 0.1 milligram, and a commercially-available industrial calculator or software.

An object to be coated (LED, LED component, or the like) 3 is set on a coated object support unit 6, which is moved by a second drive source not shown and a second drive shaft 11. The applicator 5 is fixed to a bracket 17, which is connected to a third drive source 16 and a third drive shaft 15 and moved up and down. The third drive shaft 15 is fixed to a first drive shaft 14 that moves in a direction perpendicular to the second drive shaft 11. Therefore, the applicator 5 can move in directions perpendicular to each other, while the object to be coated 3 set on the coated object support unit 6 can be shifted by pitch-feeding. Thus, the object to be coated 3 can be coated uniformly over the area of the strokes of the respective drive shafts. Besides the above-described "lateral application", "longitudinal application" may also be performed by shifting the applicator by pitch-feeding and continuously moving the coated object support unit. These ways of coating may be carried out alternately. Coating material is applied by the applicator 5 to the object to be coated 11 in one layer. Alternatively, to achieve more uniform coating, coating may be applied in a plurality of layers with the position of line feed pitch being shifted (offset) every time a layer is formed. Then, it is transferred to the next process such as a drying zone manually or automatically.

Referring to FIG. 2, the handling bracket 7 can be moved automatically from the coating booth to the coating weight measurement chamber 2 by an apparatus that swings it by 90 degrees and moves it up and down. The moving means may be, but not limited to, one that moves it forward and backward and/or swings it. It is not necessary to use an expensive apparatus such as a multi-axial or articulated robot, but an inexpensive rotary or up-and-down cylinder may be employed.

EXAMPLE

An example of the present invention will be described with reference to FIGS. 3 to 8.

Figure 3:
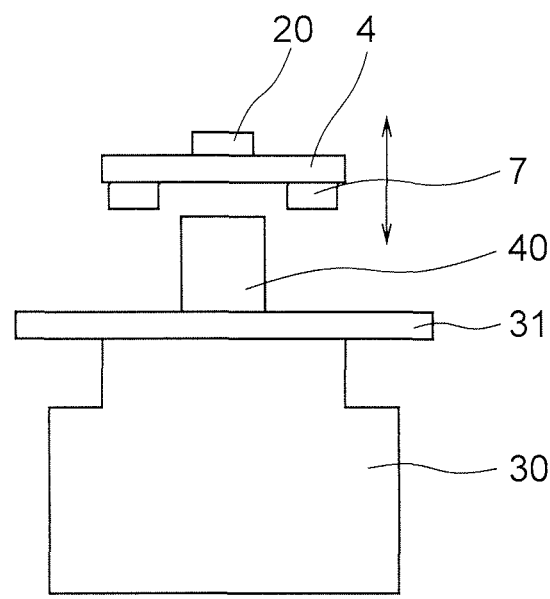
FIG. 3 is a schematic cross sectional view of a weight measuring device according to the embodiment of the present invention as seen from its side.

Referring to FIG. 3, a light-weight stand 40 that helps receiving of an object for coating weight measurement is set on a measured object table 31 of a weight measuring device 30. The handling bracket 7 is moved to a location above the weight measuring device. The handling bracket 7 has a groove having a width larger than the width of the stand 40. The handling bracket 7 is lowered down slowly so that the coating weight measurement object 4 soft-lands on the top surface of the stand 40. The object for coating measurement may be either a metal or ceramic plate or a small container. It can be reused in the succeeding measurements by applying coating material accumulatively onto the applied coating material, particularly in the case where a slurry containing a solvent is recyclable.

Figure 4:
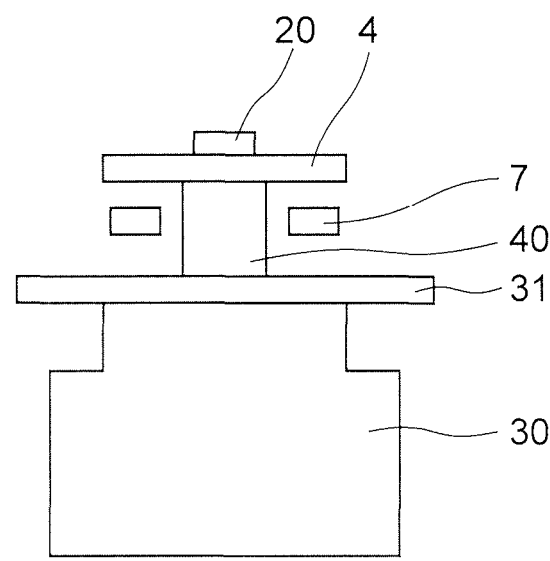
FIG. 4 is a schematic cross sectional view of the weight measuring device according to the embodiment of the present invention as seen from its side.

Referring to FIG. 4, after the object for coating weight measurement soft-lands on the top of the stand, the handling bracket is lowered so that it is completely separated from the weight measurement object, and then the weight measurement is started.

Figure 5:
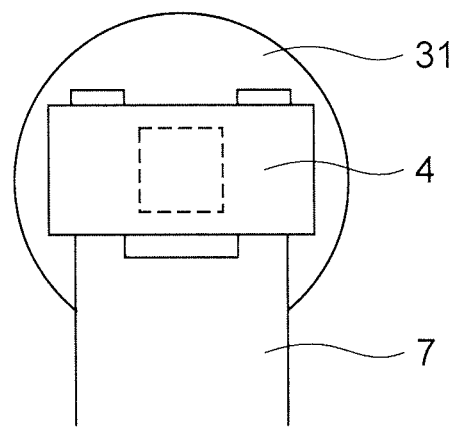
FIG. 5 is a schematic plan view of a weight measuring part according to the embodiment of the present invention.

Referring to FIG. 5, the weight measurement object 4 is simply placed on the handling bracket 7, but the handling bracket may be processed to have a shape matching the shape of the weight measurement object thereby preventing it from being displaced by vibration or other causes.

Figure 6:
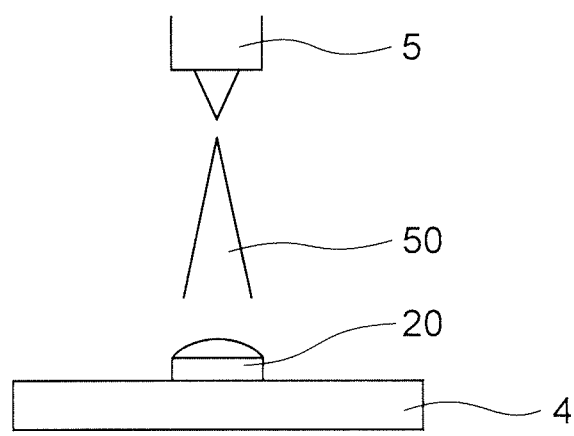
FIG. 6 is a first schematic diagram showing coating application to a weight measurement object according to the embodiment of the present invention.

Referring to FIG. 6, coating is applied from the applicator 5 to the object for coating weight measurement by spray stream 50 at one location in multiple shots. The distance between the spray ejection part and the coating weight measurement object may be equal to the distance to the object to be coated during coating. Shorter distances are better, because coating is less affected by air flows. While no limitations are placed on the duration of coating, it is preferred that a small amount of coating be done in as short time as possible in view of coating material cost. In connection with this also, it is preferred that the minimum measurable value be 0.1 milligram. In this case, however, coating can be affected by disturbance such as little air flow. Therefore, air flows ought to be shut out completely particularly during measurement by doubled measure additionally using, for example, a box that a common electronic weighing machine has.

Figure 7:
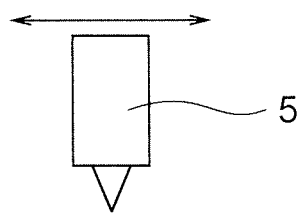
FIG. 7 is a second schematic diagram showing coating application to the weight measurement object according to the embodiment of the present invention.
Figure 7:
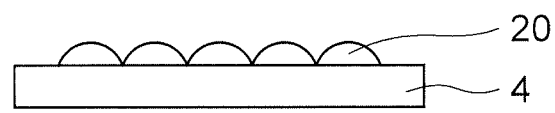

Referring to FIG. 7, coating is applied to the object for coating weight measurement in a pulsed manner while moving the applicator. If coating material diluted by an organic solvent is applied to one location multiple times, the organic solvent hardly evaporates, making accurate measurement difficult. When the flow rate of the phosphor slurry is low, nozzle clogging might occur. This also can be prevented by perform coating application with pulses of e.g. 1 to 30 hertz (60 to 1800 cycles per minute). Therefore, this method is also suitably employed in the coating application to the object to be coated as well as the weight measurement object.

Figure 8:
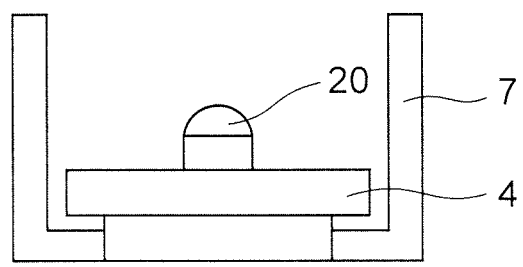
FIG. 8 is a schematic cross sectional view of the end portion of a handling bracket for the coating weight measurement object according to the embodiment of the present invention.
Figure 9:
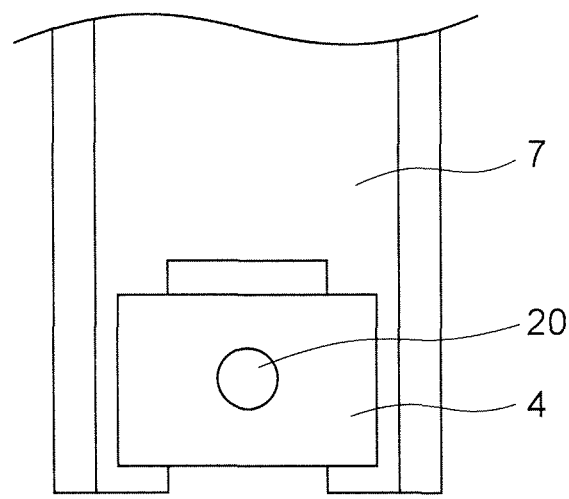
FIG. 9 is a schematic front view of the end portion of the handling bracket for the coating weight measurement object according to the embodiment of the present invention.
Figure 10:
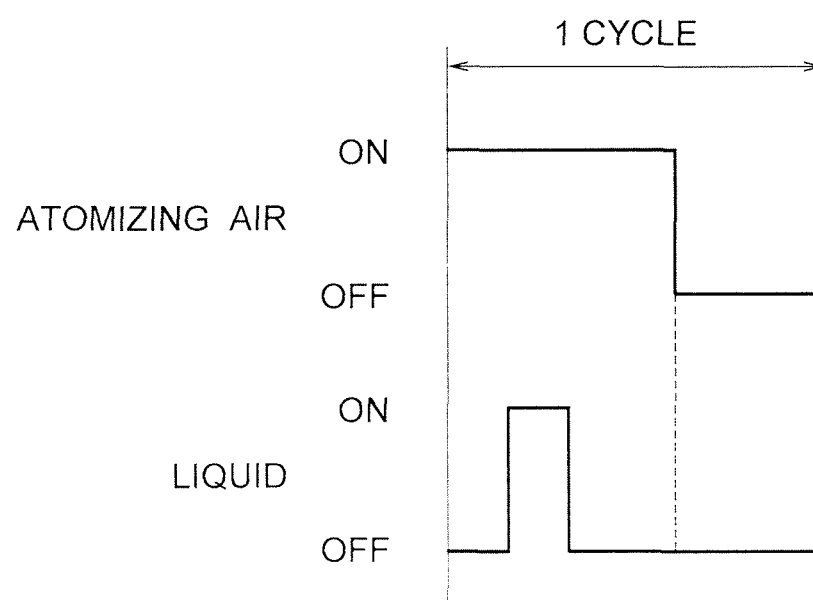
FIG. 10 is a chart of a pulsed coating application cycle according to the embodiment of the present invention.

Referring to FIGS. 8 and 9, the end of the support bracket has a C-shape so that the object for coating weight measurement is not displaced in the horizontal direction. Pulsed spraying applied with impact is advantageous in that it can adhere sprayed particles even to recessed portions, and stepped portions and, for example, edges of an LED reliably with pulsed oscillatory waves. But if it is applied to a plate or the like that is placed simply on something, the plate may be displaced by oscillatory waves in some cases. In such cases it is important that displacement in the front-back direction be avoided.

INDUSTRIAL APPLICABILITY

According to the present invention, the coating amount is measured automatically beforehand, and thereafter coating on an object to be coated is performed. Thus, stable coating quality can be ensured and high productivity can be achieved even when a coating material with which flow rate tends to be unstable is used.

REFERENCE SIGNS LIST

1: coating booth
2: coating weight measurement chamber
3: object to be coated
4: weight measurement object
5: applicator
6: coated object support unit
7: handling bracket
8: elevator device
9: opening/closing device
10: shutter
11: second drive shaft
12: belt
13: first drive source
14: first drive shaft
15: third drive shaft
16: third drive source
17: bracket
18: exhaust part
19: opening
20: coating material
30: weight measuring device
31: measurement place
40: stand

The invention claimed is:

1. A coating application method for applying coating material to an object to be coated using an applicator in an atmosphere in a gas flow, characterized by comprising:
a first step of applying said coating material to an object for coating weight measurement by said applicator before coating application to said object to be coated; and
a second step of automatically transferring said object for coating weight measurement to which the coating material has been applied to a weight measurement chamber in which at least a portion of a measuring part of a weight measuring device is exposed or disposed and which is in an atmosphere of a gas flow which does not affect weight measurement, and measuring the weight of it,
wherein while if the coating weight falls within a predetermine range, coating application to said object to be coated is performed by said applicator, if the coating weight falls out of the predetermined range, coating application to said object to be coated is performed by said applicator after correcting a coating condition.

2. A coating application method according to claim 1, characterized in that after the completion of coating application to said object to be coated, coating weight measurement is performed automatically again to check the coating amount, and thereafter the coated object is transferred to a curing oven.

3. A coating application method according to claim 1, characterized in that the coating application to said object for coating weight measurement is performed in a coating booth which is connected at least to an exhaust line and which is in an atmosphere of a gas flow and that the location at which the coating application to said object for coating weight measurement is performed and said coating weight measurement chamber are adjacent to each other.

4. A coating application method according to claim 1, characterized in that said applicator and said object to be coated are moved relatively and that said applicator is selected from at least one of a dispenser which can apply coating in a pulsed manner, inkjet, and application device which generates fine particles.

5. A coating application method according to claim 1, characterized in that said coating condition corrected includes at least one of the pressure of the coating material, relative speed of said applicator and the object to be coated, coating pitch, pulse cycle, duration of one-shot coating application, and fluid passage area.

6. A coating application method according to claim 1, characterized in that said object to be coated is an LED or LED component and that said coating material is a slurry containing a phosphor and a binder.

7. A coating application method according to claim 6, characterized in that said applicator is a fine particle generating device, that after said slurry is applied to said object for coating weight measurement and the coating weight measurement is performed in said coating weight measurement chamber, said application device which generates fine particles and the LED or LED component shift relative to each other by a pitch, and that coating application is performed with the position of the line feed pitch being shifted every time coating of one layer is finished.

8. A coating application method according to claim 7, characterized in that said fine particle generating device is an air spray device, that the distance between an ejection part at an end of the air spray device and the LED or LED component is adjustable in a range between 5 and 80 millimeters, that the ejection part and the LED or LED component are relatively shifted at a pitch between 2 and 15 millimeters, and that coating application is performed with the position of the line feed pitch being shifted by 0.1 to 7.5 millimeters every time coating of one layer is finished.

9. A coating application method according to claim 6, characterized in that the weight proportion of said phosphor in said slurry is larger than that of said binder and that said slurry contains a solvent and has a viscosity in the range between 1 and 100 mPa·s (between 1 and 100 centipoises).

10. A coating application method according to claim 9, characterized in that said slurry is circulated by a circulation device or moved between two or more small containers to avoid sedimentation of the phosphor.

11. A coating application method according to claim 1, characterized in that coating application to said object for coating weight measurement and object to be coated is performed in a pulsed manner at a frequency between 1 and 50 hertz.

12. A coating application apparatus for applying coating material to an object to be coated by an applicator in a coating booth which is connected at least to an exhaust line, characterized by consisting of:
   a first step of applying said coating material to an object for coating weight measurement by said applicator in said coating booth before coating application to said object to be coated; and
   a second step of automatically transferring said object for coating weight measurement to which the coating material has been applied to a coating weight measurement chamber which is adjacent to said coating booth and in which at least a measuring part of a weight measuring device or a portion thereof is exposed or disposed and measuring the weight of it,
   wherein if the coating weight falls within a predetermined range, coating application to the object to be coated is started.

13. A coating application apparatus according to claim 12, characterized in that a shutter which can be automatically opened and closed is provided on an opening of a partition between said coating booth and said coating weight measurement chamber, the shutter being automatically closed during the application of the coating material and during the weight measurement and made open during the transfer of said object for coating weight measurement.

14. A coating application apparatus according to claim 12, characterized in that a thin, light-weight stand is provided as a part of the measuring part in the upper portion of said coating weight measuring device.

15. A coating application apparatus according to claim 12, characterized in that said coating material is a slurry containing a phosphor and a silicone solution, that said applicator is an air spray device which sprays in a pulsed manner, that said object to be coated is an LED or LED component, that said air spray device and the LED or LED component shift relative to each other by a pitch for coating application, and that coating application is performed in a plurality of layers with the position of line feed pitch being offset every time coating of one layer is finished.

\* \* \* \* \*